(12) United States Patent
Ishimaru et al.

(10) Patent No.: US 6,355,982 B2
(45) Date of Patent: *Mar. 12, 2002

(54) SEMICONDUCTOR MEMORY DEVICE HAVING PAIRS OF BIT LINES ARRANGED ON BOTH SIDES OF MEMORY CELLS

(75) Inventors: Kazunari Ishimaru, Yokohama; Fumitomo Matsuoka, Kawasaki, both of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/210,753

(22) Filed: Dec. 15, 1998

(30) Foreign Application Priority Data

Dec. 18, 1997 (JP) ............................................. 9-349360

(51) Int. Cl.⁷ ............................................. H01L 23/48
(52) U.S. Cl. ........................ 257/758; 257/369; 257/903
(58) Field of Search ................................. 257/903, 758, 257/203, 206, 207, 390, 369

(56) References Cited

U.S. PATENT DOCUMENTS 4,710,897 A * 12/1987 Masuoka et al. ........... 365/182
5,239,201 A * 8/1993 Asano ........................ 257/758
6,005,296 A * 12/1999 Chan .......................... 257/904

FOREIGN PATENT DOCUMENTS

| JP | 61-206254 | 9/1986 |
| JP | 4-366494 | 12/1992 |

* cited by examiner

Primary Examiner—Eddie Lee
Assistant Examiner—George C. Eckert, II
(74) Attorney, Agent, or Firm—Banner & Witcoff, Ltd.

(57) ABSTRACT

In a SRAM, coupling between the adjacent bit lines is reduced and the limitation in reduction of the pattern area per memory cell is relaxed. The SRAM comprises SRAM memory cells arranged in a matrix and forming a cell array, pairs of bit lines BL and /BL extending in a column direction of the memory cell array, each of the pairs of bit lines being connected in common to the memory cells on the same column of the cell array, and the bit lines of each pair being arranged on both sides of the memory cells on the same column, a grounded line Vss, for supplying a ground potential to the memory cells, formed of the same layer as that of the pairs of bit lines and extending in the column direction, and a power supplying line Vdd, for supplying a power potential to the memory cells, formed of a layer different from that of the pairs of bit lines.

19 Claims, 3 Drawing Sheets

SEMICONDUCTOR MEMORY DEVICE HAVING PAIRS OF BIT LINES ARRANGED ON BOTH SIDES OF MEMORY CELLS

BACKGROUND OF THE INVENTION

The present invention relates to a semiconductor memory device, and more particularly to a pattern layout of a bit line and a power supplying line or a grounded line in a memory cell array, for use in, for example, a SRAM (static random access memory).

FIG. 5 shows a pattern layout of memory cells, bit line pairs, a power supplying line and a grounded line in a memory cell array of a conventional SRAM.

In FIG. 5, memory cells MC are arranged in a matrix. A word line WL for selecting a cell is connected in common to the memory cells on the same row. A pair of bit lines BL and /BL for transmitting and receiving cell data are connected in common to the memory cells on the same column. The word line WL and the pair of bit lines BL and /BL are arranged at right angles with each other.

A power supplying line Vdd is connected in common to the memory cells of the same row. A grounded line Vss is connected to the memory cells of the same row. The power supplying line Vdd and the ground line Vss are made of a layer different from that of the bit line pairs BL and /BL and arranged in parallel with the word line WL.

Since the bit line pairs BL and /BL are required to be low in resistance, they are generally made of metal, for example, aluminum.

On the other hand, in the case of a large capacity memory, the power supplying line Vdd and the grounded line Vss are formed of a single-layer wire made of polycrystalline silicon film doped with an impurity, or a multi-layer wire made of a polycrystalline silicon film and a silicide such as WSi or MoSi.

In this case, in order to make the power supplying line Vdd and the grounded line Vss low in resistance, thereby reducing the drop in potential, the aforementioned single layer or the multi-layer wire is generally backed with a metal wire, such as aluminum.

The power supplying line Vdd and the grounded line Vss may be made of metal, such as aluminum, like the bit line pairs BL and /BL. Further, the power supplying line Vdd and the grounded line Vss may make of the same layer as that of the word line WL or another layer.

The pattern layout of the SRAM as described above is advantageous in that the pattern area per memory cell (cell size) can be small, for the reason that the power supplying line Vdd and the grounded line Vss are made of a layer different from that of the bit line pairs BL and /BL.

However, for the same reason, the pattern layout of the aforementioned SRAM is disadvantageous in that a large number of manufacturing processes are required, resulting in an increased manufacturing cost.

Further, if the size of a memory cell is reduced by refinement of elements, the interval between the bit lines BL and /BL connected to the memory cell, i.e., the interval between the bit lines of the adjacent columns, is reduced. As a result, when a signal current flows through the bit lines of a column, the bit lines of the adjacent column may be influenced (a so-called coupling occurs), resulting in a problem such as a malfunction or destruction of data.

As a method for suppressing a coupling noise, Jpn. Pat. KOKAI Appln. No. 61-206254 relating to "Semiconductor Memory Device" discloses a technique for reducing crosstalk (coupling) by arranging the power supplying line Vdd between bit lines BL and /BL of the adjacent columns along the bit lines and a grounded line GND. This technique is shown in FIG. 6. In FIG. 6, a reference symbol MC denotes a memory cell and WL a word line.

Jpn. Pat. KOKAI Appln. No. 4-366494 relating to "Semiconductor Memory Device" discloses a technique for preventing occurrence of a defect in data reading and writing by arranging a power supplying line PL between a digit line DL or /DL and a grounded line GL. This technique is shown in FIG. 7. In FIG. 7, a reference symbol MC denotes a memory cell and WL a word line.

These techniques, however, are disadvantageous in that reduction in pattern area per memory cell is limited, since the bit line pairs BL and /BL (or digit line pairs DL and /DL), the power supplying line Vdd and the grounded line GND (or GL) are made of the same layer.

Thus, the conventional semiconductor devices have a drawback in that reduction in pattern area per memory cell is limited, since the power supplying line and the grounded line are formed in the same layer along the bit lines to reduce the coupling between the adjacent bit lines.

BRIEF SUMMARY OF THE INVENTION

The present invention solves the above drawbacks of the conventional art. An object of the present invention is to provide a semiconductor memory device, which can reduce coupling between the adjacent bit lines and relax the limitation in reduction of the pattern area per memory cell.

According to the present invention, there is provided a semiconductor memory device comprising: a memory cell array in which memory cells of a static type are arranged in a matrix; a plurality of pairs of bit lines extending in a column direction of the memory cell array, each of the pairs of bit lines being connected in common to memory cells on a same column of the memory cell array, and the bit lines of each of the pairs being arranged on both sides of the memory cells on the same column; a plurality of word lines extending in a row direction of the memory cell array and connected in common to memory cells on a same row of the memory cell array; a grounded line, for supplying a ground potential to the memory cells, formed of a layer same as that of the pairs of bit lines and extending in the column direction; and a power supplying line, for supplying a power potential to the memory cells, formed of a layer different from that of the pairs of bit lines.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention and together with the general description given above and the detailed description of the preferred embodiments given below, serve to explain the principles of the invention.

DETAILED DESCRIPTION OF THE INVENTION

An embodiment of the present invention will be described in detail with reference to the accompanying drawings.

Figure 1:
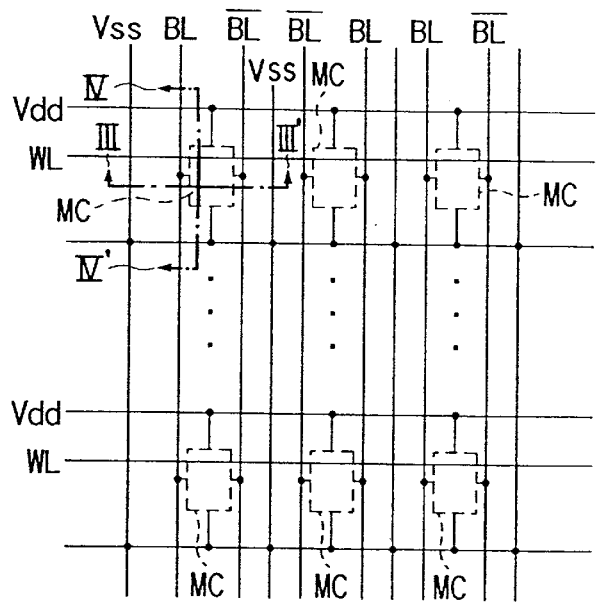
FIG. 1 is a block diagram showing a semiconductor device according to an embodiment of the present invention.

FIG. 1 shows an example of the pattern layout of a SRAM according to an embodiment of the semiconductor memory device of the present invention.

In FIG. 1, memory cells MC are arranged in a matrix.

Figure 2:
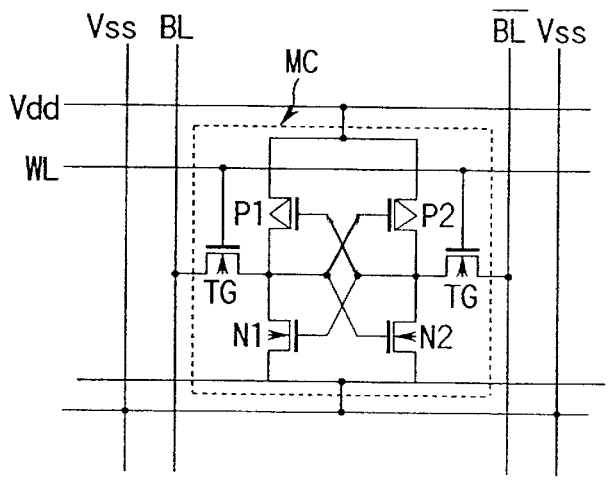
FIG. 2 is a circuit diagram showing an example of the memory cell shown in FIG. 1.
Figure 5:
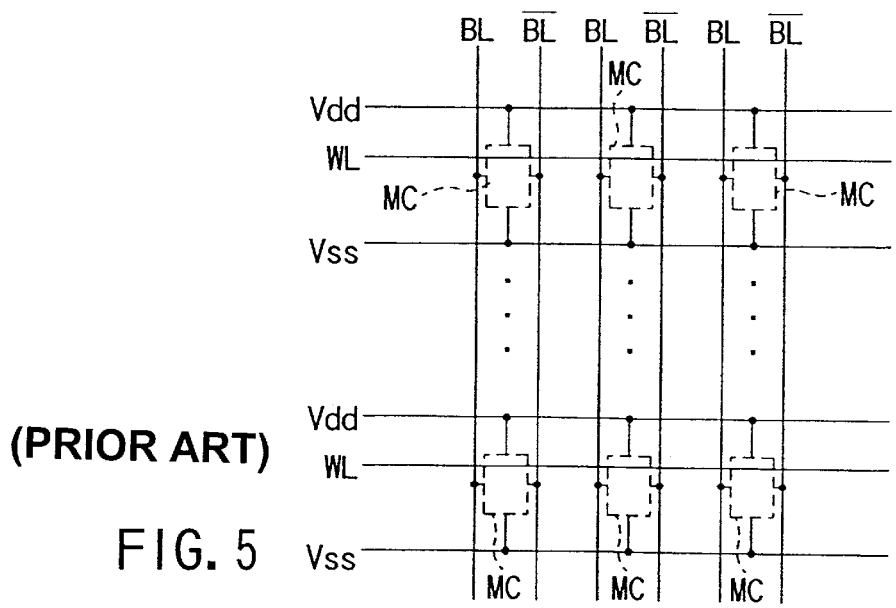
FIG. 5 is a circuit diagram showing a conventional SRAM.

Each memory cell MC comprises, as shown in FIG. 2, a pair of NMOS transistors N1 and N2 for a sensing purpose, a pair of PMOS transistors P1 and P2 serving as load elements, and a pair of NMOS transistors serving as transfer gates TG.

A word line WL for selecting a cell is connected in common to the gates of the pair of transistors serving as the transfer gates TG of the memory cells on the same row. A pair of bit lines BL and /BL, for transmitting and receiving data, are connected in common to terminals of the transistors for the transfer gates TG of the memory cells on the same column. The word line WL and the pair of bit lines BL and /BL are arranged at right angles with each other.

A grounded line Vss is connected in common to the memory cells on the same row. The line Vss is made of the same layer as that of the pair of bit lines BL and /BL, and arranged in the column direction between the adjacent pairs of bit lines (BL, /BL) and (/BL, BL).

Next, the arrangement of word line WL, bit lines BL, /BL, ground line Vss, and power supplying line Vdd in this embodiment will be described down below with reference to FIG. 3 and FIG. 4.

Figure 3:
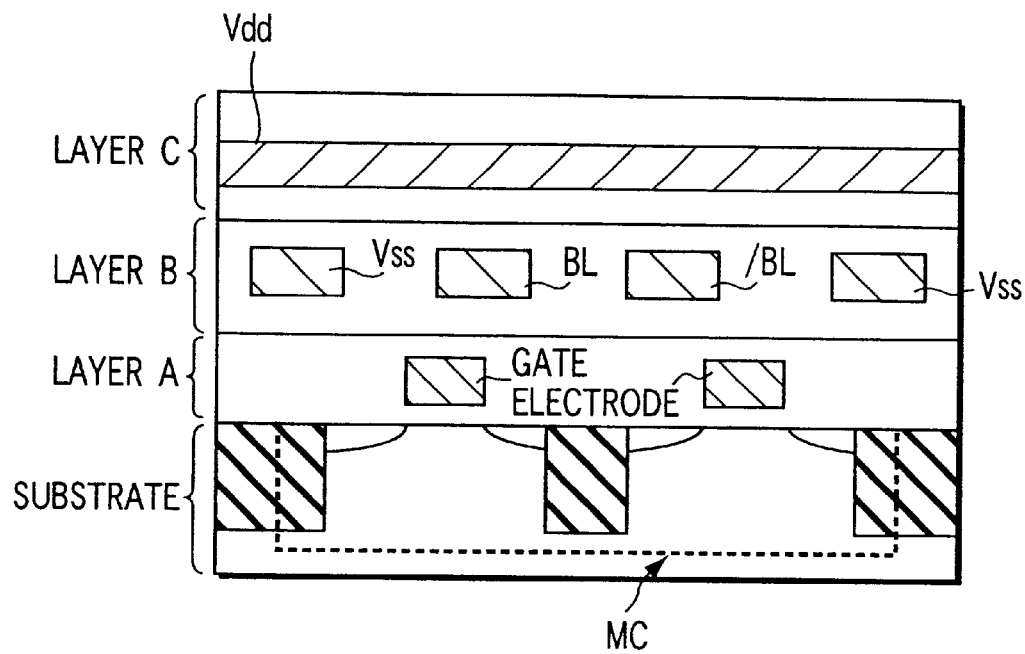
FIG. 3 is a sectional view along line III–III' in FIG. 1.

FIG. 3 is a sectional view along line III–III' shown in FIG. 1. A memory cell MC is provided in the substrate, and gate electrodes are disposed in layer A formed on the substrate. A pair of bit lines BL and /BL are formed in layer B provided on layer A, in the direction perpendicular to the section. Ground lines Vss are disposed on both sides of the pair of bit lines BL and /BL in the direction parallel thereto, and a power supplying line Vdd is provided in layer C formed on layer B, in the direction parallel to the section.

Figure 4:
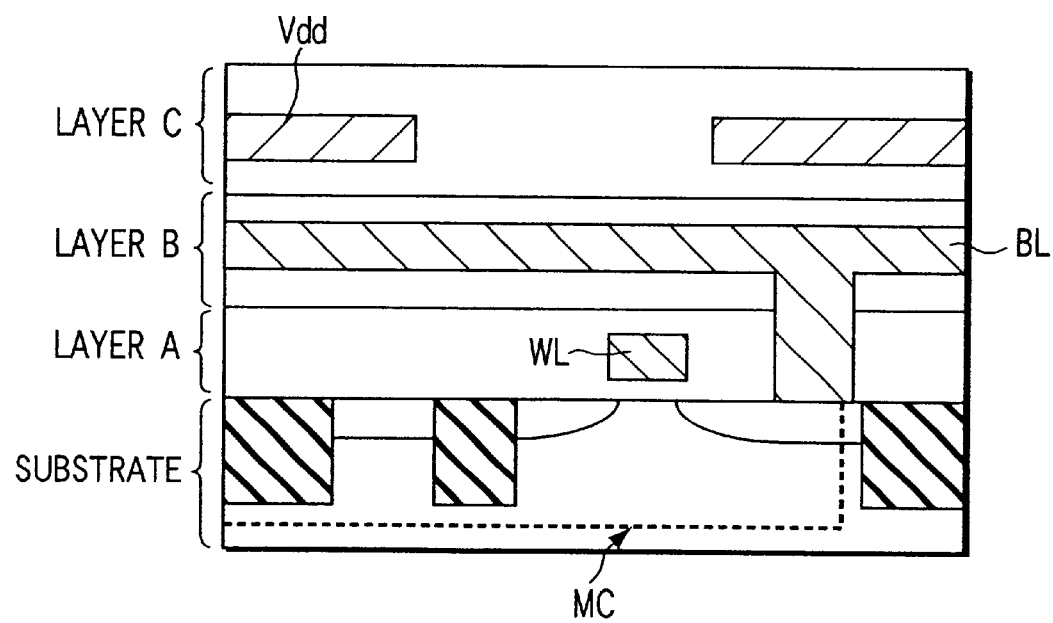
FIG. 4 is a sectional view along line IV–IV' in FIG. 1.
Figure 6:
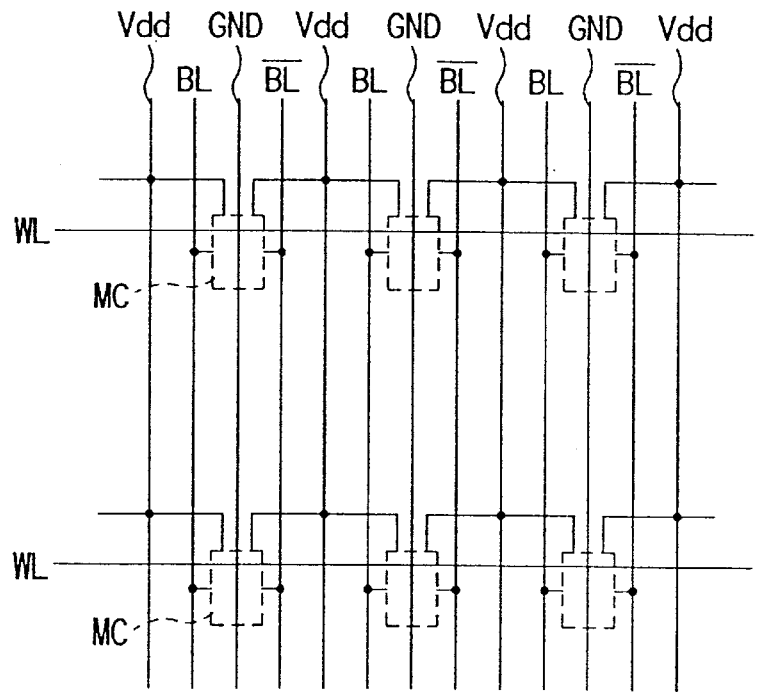
FIG. 6 is a circuit diagram showing a conventional SRAM in which occurrence of a coupling noise is prevented.
Figure 7:
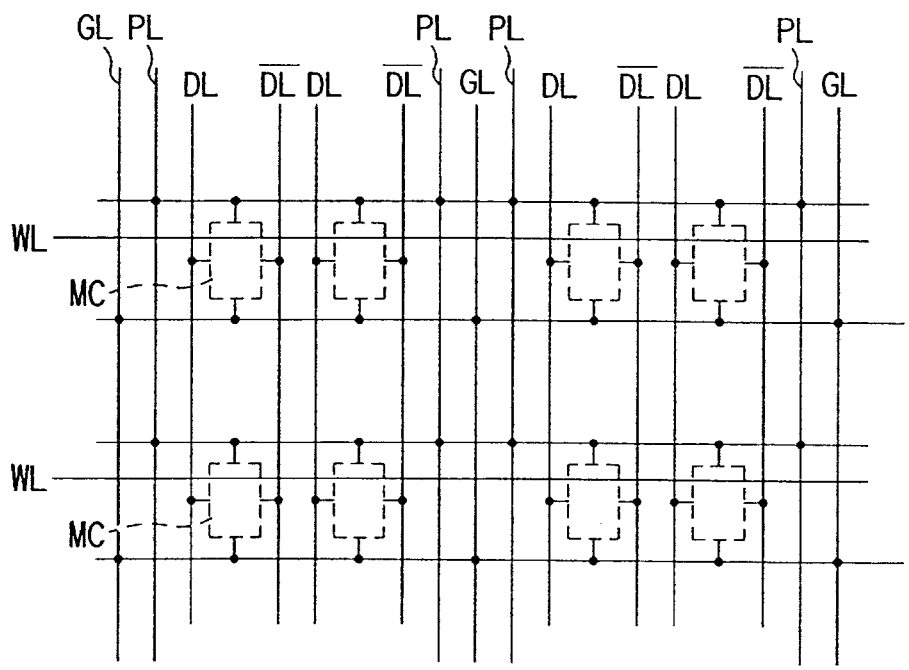
FIG. 7 is a circuit diagram showing a conventional SRAM in which occurrence of a defect in data reading and writing is prevented.

FIG. 4 is a sectional view along line IV–IV ' shown in FIG. 1. A memory cell MC is provided in the substrate. Word line WL is arranged in layer A in the direction perpendicular to the section, i.e., in the direction orthogonal to bit line BL (and bit line /BL not shown in FIG. 4). Bit line BL is disposed in layer B in the direction parallel to the section of FIG. 4. Further, power supplying line Vdd is provided in layer C in the direction perpendicular to the section of FIG. 4.

As is clearly seen from FIGS. 3 and 4, ground line Vss and the pair of bit lines BL and /BL are provided in the same layer, while power supplying line Vdd is arranged in a different layer from the layer of the pair of bit lines BL and /BL. In the embodiment of the invention, power supplying line Vdd and the pair of bit lines BL and /BL are formed in adjacent layers, but the invention should not be limited to this arrangement. Other layers or a substrate may be interposed between the layers for the power supplying line and the bit lines in alternative embodiments of the present invention.

A power supplying line Vdd is connected in common to the memory cells on the same row. It is made of a layer different from that of the pair of bit lines BL and /BL (i.e., a layer upper or lower than the pair of bit lines BL and /BL). In this embodiment, the power supplying line Vdd is arranged in parallel with the word line WL.

Since the bit line pair BL and /BL (and the grounded line Vss made of the same layer) are required to be low in resistance, they are generally made of metal, for example, aluminum.

The power supplying line Vdd may be made of metal such as aluminum like the bit line pair BL and /BL. Otherwise, in the case of a large capacity memory, the power supplying line Vdd may be formed of a single-layer wire made of polycrystalline silicon film doped with an impurity, or a multi-layer wire made of a polycrystalline silicon film and a silicide, such as WSi2, MoSi2, NiSi, TiSi2, CoSi2, or PtSi2, based on high melting-point metal.

In order to make the power supplying line Vdd and the grounded line Vss low in resistance, so that the potential drop can be reduced, the word line shunt method may be employed to back the aforementioned single-layer or the multi-layer wire with a metal wire such as aluminum.

The power supplying line Vdd may be made of the same layer as that of the word line WL or another layer.

With the pattern layout and the wiring structure of the SRAM of the above embodiment, the grounded line Vss, made of the same layer as that of the pair of bit lines BL and /BL, is arranged in the column direction between the adjacent pairs of bit lines (BL, /BL) and (/BL, BL). Therefore, the coupling between the bit lines in the adjacent columns can be reduced.

Since the power supplying line Vdd is made of a different layer as that of the bit line pairs BL and /BL, the number of manufacturing steps is somewhat increased. However, the pattern layout of the memory cell is not restricted. As a result, the limitation in reduction of the pattern area per memory cell can be relaxed.

Moreover, since the power supplying line Vdd is made of a different layer from that of the bit line pairs BL and /BL, the width of the power supplying line Vdd can be widened. For this reason, the resistance of the power supplying line Vdd can be lowered. As a result, a voltage drop due to the wire resistance (a change in voltage due to a change in current) of the power supplying line Vdd can be reduced. Consequently, the present invention provides an advantage that the operation margin of the memory cell can be increased.

Particularly, in a case where the power supplying line Vdd is arranged in parallel with the word line WL or made of a layer different from that of the word line WL, the width of the power supplying line Vdd can be widened easily. In this case, therefore, the above advantage is more remarkable.

As has been described above, according to the present invention, coupling between the adjacent bit lines can be reduced and the limitation in reduction of the pattern area per memory cell can be relaxed.

In addition, the following advantage can be obtained by arranging ground lines Vss parallel to bit lines BL, /BL. In general, each word line WL is shared by a plurality of memory cells. When a word line is selected in a read process, currents flow from all the memory cells sharing the word line to a ground line. In a conventional layout where bit lines are arranged orthogonal to a ground line, a current from all memory cell flows into the same ground line. For instance, assuming that a cell current is 150 µA and the number of the memory cells sharing the word line is 32, the total amount of current flowing into the ground line will be thirty-two times of 150 µA, i.e., 4.8 mA. In order to allow such a great amount of current flow, it is necessary to employ a wide ground line to secure a sufficient electro-migration resistance. Further, in some cases, it may be necessary to embed a contact that is connected to the ground line. Those may require a large area for a memory cell and additional processing steps. An embodiment of the present invention having ground line Vss and bit lines BL, /BL arranged in parallel does not require such a wide ground line or an embedded contact, since a current from only one memory cell flows into the ground line at a time in the embodiment of the present invention (only one word line can be selected at a time). Therefore, the present invention can reduce the size of a memory cell and the number processing steps.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a memory cell array in which memory cells of a static type are arranged in a matrix;
    a plurality of pairs of bit lines extending in a column direction of the memory cell array, each of said pairs of bit lines being connected in common to memory cells on a same column of the memory cell array;
    a plurality of word lines extending in a row direction of the memory cell array, each word line being connected in common to memory cells on a same row of the memory cell array;
    a plurality of grounded lines disposed on both sides of each pair of bit lines in a direction parallel to the bit lines, for supplying a ground potential to the memory cells, formed of a layer same as that of the pairs of bit lines and extending in the column direction; and
    power supplying lines, for supplying a power potential to the memory cells, formed of a conductive layer other than a diffusion layer, the conductive layer being different from that of the pairs of bit lines and extending in the row direction.

2. The semiconductor memory device according to claim 1, wherein the power supplying lines are arranged in parallel with the word lines.

3. The semiconductor memory device according to claim 1, wherein the power supplying lines are formed in a layer different from that of the word lines.

4. The semiconductor memory device according to claim 1, wherein the pairs of bit lines and the grounded line are formed of metal.

5. The semiconductor memory device according to claim 4, wherein the power supplying lines are made of the same metal material as the pairs of bit lines and the grounded lines.

6. The semiconductor memory device according to claims 1, wherein the power supplying lines each are a multi-layer wire of a polycide structure, in which polycrystalline silicon and silicide based on a high melting-point metal are laminated.

7. The semiconductor memory device according to claim 2, wherein the power supplying lines are formed in a layer different from that of the word lines.

8. The semiconductor memory device according to claim 2, wherein the pairs of bit lines and the grounded line are formed of metal.

9. The semiconductor memory device according to claim 8, wherein the power supplying lines are made of the same metal material as the pairs of bit lines and the grounded lines.

10. The semiconductor memory device according to claim 1, wherein the power supplying lines each are a multi-layer wire of a polycide structure, in which polycrystalline silicon and silicide based on a high melting-point metal are laminated.

11. The semiconductor memory device according to claim 3, wherein the pairs of bit lines and the grounded line are formed of metal.

12. The semiconductor memory device according to claim 11, wherein the power supplying lines are made of the same metal material as the pairs of bit lines and the grounded lines.

13. The semiconductor memory device according to claim 3, wherein the power supplying lines each are a multi-layer wire of a polycide structure, in which polycrystalline silicon and silicide based on a high melting-point metal are laminated.

14. The semiconductor memory device according to claim 7, wherein the pairs of bit lines and the grounded line are formed of metal.

15. The semiconductor memory device according to claim 7, wherein the power supplying lines are made of the same metal material as the pairs of bit lines and the grounded lines.

16. The semiconductor memory device according to claim 7, wherein the power supplying lines each are a multi-layer wire of a polycide structure, in which polycrystalline silicon and silicide based on a high melting-point metal are laminated.

17. The semiconductor memory device according to claim 14, wherein the power supplying lines are made of the same metal material as the pairs of bit lines and the grounded lines.

18. The semiconductor memory device according to claim 14, wherein the power supplying lines each are a multi-layer wire of a polycide structure, in which polycrystalline silicon and silicide based on a high melting-point metal are laminated.

19. A semiconductor memory device comprising:
    a memory cell array in which memory cells of a static type are arranged in a matrix;
    a plurality of pairs of bit lines extending in a column direction of the memory cell array, each of said pairs of bit lines being connected in common to memory cells on a same column of the memory cell array;
    a plurality of word lines extending in a row direction of the memory cell array, each word line being connected in common to memory cells on a same row of the memory cell array;
    a plurality of grounded lines disposed on both sides of each pair of bit lines in the direction parallel to the bit lines, the plurality of grounded lines extending in the column direction; and
    power supply lines, for supplying a power potential to the memory cells, formed of a conductive layer other than a diffusion layer and the conductive layer being different from that of the pairs of bit lines and extending in the row direction;

wherein each of the memory cells is composed of first, second, third, fourth, fifth and sixth transistors, the first and second transistors being connected serially between one of said power supply lines and one of said grounded lines, the third and fourth transistors being connected serially between the one of said power supply lines and the one of said grounded lines, a first connection node between the first and second transistors being connected to gates of the third and fourth transistors, a second connection node between the third and fourth transistors being connected to gates of the first and second transistors, the first connection node being connected to one of a pair of bit lines via the fifth transistor acting as a first transfer gate, and the second connection node being connected to the other of the pair of bit lines via the sixth transistor acting as a second transfer gate.

* * * * *

UNITED STATES PATENT AND TRADEMARK OFFICE
CERTIFICATE OF CORRECTION

PATENT NO.    : 6,355,982 B2
DATED         : March 12, 2002
INVENTOR(S)   : Kazunari Ishimaru et al.

It is certified that error appears in the above-identified patent and that said Letters Patent is hereby corrected as shown below:

<u>Title page,</u>
Item [56], References Cited, U.S. PATENT DOCUMENTS, insert
-- 5,930,163    7/1999    Hara et al.    365/154
   5,744,844    4/1998    Higuchi        257/369 --

Signed and Sealed this

Fourth Day of March, 2003

JAMES E. ROGAN
*Director of the United States Patent and Trademark Office*